United States Patent [19]
Köhler et al.

[11] Patent Number: 5,837,746
[45] Date of Patent: Nov. 17, 1998

[54] COREACTIVE PHOTOINITIATORS

[75] Inventors: Manfred Köhler, Darmstadt; Jörg Ohngemach, Reinheim; Eike Poetsch; Rudolf Eidenschink, both of Mühtal, all of Germany; Gerhard Greber, Vöslau, Austria; Dieter Dorsch, Darmstadt, Germany; Jürgen Gehlhaus, Lautertal, Germany; Konrad Dorfner, Darmstadt, Germany; Hans Ludwig Hirsch, Reinheim, Germany

[73] Assignee: Ciba Specialty Chemicals Corporation, Tarrytown, N.Y.

[21] Appl. No.: 880,384

[22] Filed: Jun. 23, 1997

Related U.S. Application Data

[60] Continuation of Ser. No. 703,494, Aug. 27, 1996, abandoned, which is a division of Ser. No. 618,701, Mar. 20, 1996, Pat. No. 5,744,512, which is a division of Ser. No. 252,729, Jun. 2, 1994, Pat. No. 5,532,112, which is a continuation of Ser. No. 951,299, Sep. 24, 1992, abandoned, Ser. No. 720,141, Jun. 24, 1991, abandoned, and Ser. No. 167,060, Mar. 11, 1988, abandoned.

[30] Foreign Application Priority Data

Mar. 12, 1987 [DE] Germany .................. 37 07 891.7
Nov. 13, 1987 [DE] Germany .................. 37 38 567.4

[51] Int. Cl.$^6$ .............. C08F 2/50; C08K 3/22; C08L 63/10; C08L 75/16
[52] U.S. Cl. ............... 522/8; 522/12; 522/17; 522/18; 522/20; 522/33; 522/34; 522/35; 522/38; 522/42; 522/64; 522/50; 522/51; 522/55; 522/57; 522/59; 522/63; 522/49; 522/14; 522/15; 522/43; 522/44; 522/904; 522/53; 522/81; 522/103; 522/96; 522/95
[58] Field of Search ............... 522/38, 42, 64, 522/50, 51, 57, 55, 59, 49, 14, 15, 17, 18, 8, 33, 34, 39, 43, 44, 35, 904, 12, 63, 81, 103, 95, 96

[56] References Cited

U.S. PATENT DOCUMENTS

| | | | |
|---|---|---|---|
| 3,429,852 | 2/1969 | Skoultchi | 260/47 |
| 3,574,617 | 4/1971 | Skoultchi | 522/8 |
| 3,632,493 | 1/1972 | Rogers | 204/159.14 |
| 3,801,329 | 4/1974 | Sandner et al. | 522/8 |
| 4,077,806 | 3/1978 | Muzyczko et al. | 96/115 |
| 4,148,987 | 4/1979 | Winey | 526/316 |
| 4,257,859 | 3/1981 | Fischer et al. | 204/159.23 |
| 4,265,723 | 5/1981 | Hesse et al. | 522/64 |
| 4,279,721 | 7/1981 | Kirchmayr et al. | 204/159.24 |
| 4,324,744 | 4/1982 | Lechtken et al. | 522/64 |
| 4,348,530 | 9/1982 | Kuita et al. | 549/27 |
| 4,371,606 | 2/1983 | Dönges | 430/281 |
| 4,371,607 | 2/1983 | Dönges | 430/281 |
| 4,385,109 | 5/1983 | Lechtken et al. | 522/64 |
| 4,418,138 | 11/1983 | Curtis | 430/253 |
| 4,436,570 | 3/1984 | Neuhaus et al. | 156/273.3 |
| 4,459,416 | 7/1984 | Curtis et al. | 549/27 |
| 4,475,999 | 10/1984 | Via | 204/159.23 |
| 4,496,447 | 1/1985 | Eichler et al. | 204/159.16 |
| 4,519,883 | 5/1985 | Via | 204/159.15 |
| 4,544,467 | 10/1985 | Bunker et al. | 204/159.24 |
| 4,564,578 | 1/1986 | Finter et al. | 430/270 |
| 4,576,975 | 3/1986 | Reilly, Jr. | 522/13 |
| 4,582,862 | 4/1986 | Berner et al. | 522/14 |
| 4,602,097 | 7/1986 | Curtis | 549/27 |
| 4,661,434 | 4/1987 | Iwasaki et al. | 430/281 |
| 4,672,079 | 6/1987 | Li Bassi et al. | 522/35 |
| 4,847,137 | 7/1989 | Kellen et al. | 428/195 |
| 4,861,916 | 8/1989 | Köhler et al. | 568/337 |
| 4,922,004 | 5/1990 | Köhler et al. | 560/221 |
| 4,946,960 | 8/1990 | Wade et al. | 548/150 |
| 5,045,573 | 9/1991 | Köhler et al. | 522/42 |
| 5,130,227 | 7/1992 | Wade et al. | 430/286 |

FOREIGN PATENT DOCUMENTS

| | | | |
|---|---|---|---|
| 3203096 | 8/1983 | Germany | 522/33 |
| 8605778 | 10/1986 | Germany . | |
| 1230603 | 7/1989 | Japan . | |

OTHER PUBLICATIONS

Abstract for EP 143201.
Abstract for EP 167489.
Abstract for AU 8428804.

*Primary Examiner*—Susan W. Berman
*Attorney, Agent, or Firm*—Luther A. R. Hall

[57] ABSTRACT

Compounds of the formula

RG—A—IN wherein IN is a photoinitiator basic structure A is a spacer group and RG is a functional reactive group can be employed as coreactive photoinitiators for photopolymerization of systems containing ethylenically unsaturated compounds.

17 Claims, No Drawings

COREACTIVE PHOTOINITIATORS

This is a CONTINUATION of application Ser. No. 08/703,494 filed Aug. 27, 1996, now abandoned, which is a DIVISIONAL of application Ser. No. 08/618,701 filed Mar. 20, 1996, now U.S. Pat. No. 5,744,512, which is a DIVISIONAL of application Ser. No. 08/252,729 filed Jun. 2, 1994, now U.S. Pat. No. 5,532,112, which is a CONTINUATION of application Ser. No. 07/951,299 filed Sep. 24, 1992, now abandoned, which is a CONTINUATION of application Ser. No. 07/720,141 filed Jun. 24, 1991, now abandoned, which is a CONTINUATION of application Ser. No. 07/167,060 filed Mar. 11, 1988, now abandoned.

BACKGROUND OF THE INVENTION

The invention relates to coreactive photoinitiators for photopolymerization of systems containing ethylenically unsaturated compounds.

Photochemically induced polymerization reactions have taken on great importance in industry, in particular when rapid hardening of thin layers is important, such as, for example, on hardening of paint and resin coatings on paper, metal and plastic, or on drying of printing inks, since these processes are distinguished compared to conventional methods of printing and coating objects through a saving in raw materials and energy and less environmental pollution. However, the preparation of polymer materials per se through polymerization of appropriate unsaturated monomeric starting materials is also frequently carried out photochemically, it being possible to use conventional processes such as solution and emulsion polymerization.

Since, in the reactions mentioned, none of the reactants is generally capable of absorbing the photo-chemically active radiation to an adequate extent, it is necessary to add so-called photoinitiators which are capable of either absorbing incident high-energy radiation, usually UV light, to form active starter radicals, which themselves initiate the photopolymerization, or of transferring the absorbed energy to one of the polymerizable reactants for free-radical formation. The initiators do not normally participate in the actual polymerization reaction.

The major initiators which have hitherto been employed for photopolymerization of unsaturated compounds are benzophenone derivatives, benzoin ethers, benzil ketals, dibenzosuberone derivatives, anthraquinones, xanthones, thioxanthones, α-haloacetophenone derivatives, dialkoxyacetophenones and hydroxyalkylphenones.

As is known, however, the industrial applicability of many of the substances mentioned is limited, in some cases considerably, by a number of disadvantages. These include, in particular, a frequently unsatisfactory reactivity in the ability to initiate photopolymerization of ethylenically unsaturated compounds. Besides molecule-specific reactivity, the solubility or the ability of the photoinitiators to be incorporated as homogeneously as possible into the photopolymerizable systems frequently plays a crucial role here.

Further problems are the dark-storage stability of the systems to which photoinitiators have been added and the possible influencing of the final product by radicals or degradation products of the photoinitiator. Such radicals can lead to a more or less pronounced effect on the product's properties, depending on the nature and quantity. In photopolymerized paint coatings, the major area of application for photoinitiators, for example, such radicals can affect the final achievable hardness of the coating; in addition, undesired color changes, for example yellowing, can occur, often only after a relatively long time. Initiator radicals or degradation products thereof can become noticeable due to an unpleasant odour as a consequence of their more or less pronounced volatility; their diffusion from the coating into the surrounding media can cause problems, for example in packaging materials which are provided with photopolymerized coatings, such as, for example, cans and tubes for foods. It is precisely in this area of application that the question of applicability is definitively determined by the possible or proven toxicity of the photoinitiators and the degradation products thereof.

A particular problem, above all with respect to broad application of photoinitiators, is that they can, naturally, only be employed in systems which essentially contain components having olefinic double bonds which can be polymerized by means of free radicals.

Thermocurable systems based exclusively on polyaddition or polycondensation reactions which are not induced by free radicals cannot be converted into radiation-curable systems by adding free radical-forming photoinitiators. Accordingly, the choice of materials for components for radiation-curable systems is limited. Many material-specific properties of thermocurable systems cannot or cannot yet be used in radiation-curable systems without further action. One alternative here is provided by so-called hybrid binder systems, in which thermocurable and photochemically curable components are combined and in which the thermal and photochemical reactions can take place simultaneously or successively. However, compatibility problems, in particular with respect to the photoinitiators to be employed frequently arise during development of such systems. Thus there continued to be a particular demand among experts for photoinitiators which, besides excellent initiator properties and good dark storage stability of the systems to which they have been added, also have a broad applicability, even in systems with a complex composition, and which can themselves, or their photolysis products, be bound in such systems in a migration-resistant manner.

Individual steps in this direction have already been taken. Thus, for example, German Offenlegungsschrift 3,534,645 and European Offenlegungsschrift 161,463 describe photoinitiators of the hydroxyalkylphenone type which carry specifically olefinically unsaturated substituents. These initiators or their photolysis products can be bound into the polymer composition by copolymerization with the components of the radiation-curable system. They can alternatively initially be thermally polymerized themselves and then, as polymeric and as migration-resistant photoinitiators, introduced into the radiation-curable system. However, these specific copolymerizable or polymeric photoinitiators have an only limited range of applications.

SUMMARY OF THE INVENTION

It is therefore an object of this invention to provide photoinitiators which are structured so that, besides the ability to initiate polymerization of ethylenically unsaturated compounds by means of the action of radiation, they also have the property of reacting with any desired components of radiation-curable systems, irrespective of whether these participate in the photopolymerization reaction or not, while still retaining the ability to be stably bound into the resultant polymer composition.

Upon further study of the specification and appended claims, further objects and advantages of this invention will become apparent to those skilled in the art.

It has been found that these objects can be achieved in an excellent fashion by compounds of the formula

in which

IN is a photoinitiator basic structure

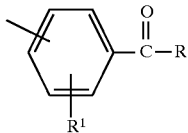

wherein

R is

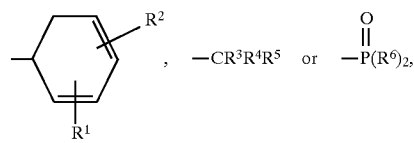

and $R^1$ is H, $C_{1-12}$-alkyl, halogen or the RG—A— group, or two $R^1$ radicals in the ortho position to the carbonyl group together are alter-natively —S—, $R^2$ is H, halogen, $C_{1-12}$-alkyl or $C_{1-12}$-alkoxy or the RG—A— group, $R^3$, $R^4$ in each case independent of one another are H, $C_{1-12}$-alkyl, $C_{1-12}$-alkenyl, $C_{1-12}$-alkoxy or phenyl, or together are $C_{2-6}$-alkylene, $R^5$ is $OR^7$, $N(R^7)_2$,

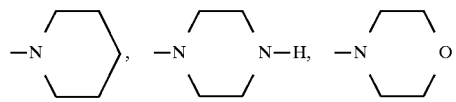

s or $SO_2R^7$, $R^6$ is $C_{1-6}$-alkyl, $C_{1-6}$-alkanoyl, phenyl benzoyl, each of which is optionally substituted by halogen, $C_{1-6}$-alkyl or $C_{1-6}$-alkoxy, $R^7$ is H, $C_{1-6}$-alkyl or $C_{1-6}$-alkanoyl, A is a spacer group $Z[(CH_2)_oY]_n\text{-}[(CH_2)_mX]_l$ wherein X, Y and Z, in each case independently of one another, are a single bond, —O—, —S—, —NH—, —CO—, —COO—, —CONH—, —O—CO—, —NH—CO— or —NH—COO—, l and m are the numbers 1 to 4, n and o are the numbers 0 to 4, RG is one of the functional reactive groups HO—, HS—, $H_2N$—, halogen, HO—CO—, $H_2N$—CO—, O=C=N—, S=C=N—, $N_3$—, $SO_3H$, $SO_2Cl$, $R^cR^bC=CR^a$—$R^a$-

$R^a$, $R^b$ and $R^c$ are in each case independently of one another H or $CH_3$, and with the proviso that Z is not —COO— when n is 0 and $R^5$ is $OR^7$, or RG is halogen, cyclopropyl, oxiranyl, O=C=N—$R^d$,

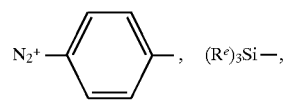

$R^d$ is $C_{1-6}$-alkylene or phenylene, and $R^e$ is halogen, $C_{1-12}$-alkyl, $C_{1-12}$-alkoxy or $C_{1-12}$-alkanoyloxy.

DETAILED DESCRIPTION

Some of the compounds of formula I are new. The compounds of formula I are highly reactive photoinitiators which, irrespective of their photoreactivity, can enter into non-photochemically induced (co)reactions and are therefore to be called coreactive photoinitiators.

In the context of the invention, coreactions are to be understood as all reactions which the photoinitiators or the photolysis products thereof enter into with components of radiation-curable systems, with themselves or alternatively with the substrate to which these or an appropriate radiation-curable system is applied as a paint or coating, and which cause fixed-location bonding of the photoinitiators or the degradation products thereof. These coreactions are primarily reactions in which covalent chemical bonds are made. However, reactions are also possible in which the fixing action is based on other interactions, such as, for example, ionic or polar interactions.

The particular advantage of the compounds according to the invention over conventional photoinitiators arises from the presence of the reactive RG group, which is linked to the spacer group A and which, in addition to specific photoreactivity, gives these compounds the opportunity of undergoing non-photochemical reactions. The variety of reactive groups allows custom matching to a very wide variety of applications. The coreaction can take place, independently of the actual photoreaction before, during or after the latter. The custom matching can be affected by those of ordinary skill using fully conventional considerations, perhaps with a few routine optimization experiments.

Surprisingly, this leads to an unexpectedly large extent of incorporation of the unreacted photoinitiators or photoinitiator degradation products into the polymer product which is finally obtained. This very effectively allows undesired influences on the properties of the final product to be reduced or entirely eliminated.

In addition, fixing of photoinitiators directly to the substrate or in the form of a coating of oligomeric, polymeric or copolymerized photoinitiators offers better anchoring of photopolymerizable coatings applied to the latter to the substrate or better coating hardening due to initiator concentrations which are particularly high locally. In this application, in particular, interesting effects and new properties can be achieved.

Many compounds of the formula I are, in addition, valuable synthesis intermediates on the route to further functionalized photoinitiators or radiation-reactive systems having a covalently bound photoinitiator.

The invention thus relates to the use of the compounds of the formula I as coreactive photoinitiators for photopolymerization of systems containing ethylenically unsaturated compounds, in particular in the radiation curing of coatings having UV-curable paint and binder systems, above all also hybrid binder systems.

The invention also relates to those compounds of formula I per se which are novel.

The invention furthermore relates to a process for photopolymerization of systems containing ethylenically unsaturated compounds, at least one compound of the formula I being added as a coreactive photoinitiator to the mixture before initiation of the photopolymerization.

In addition, the invention relates to photo-polymerizable systems containing at least one ethylenically unsaturated, photopolymerizable compound and, if appropriate, further known and conventional additives, the systems containing at least one compound of the formula I as a coreactive photoinitiator.

Finally, the invention relates to the use of compounds of the formula I as synthesis intermediates in the preparation of further-functionalized photoinitiators and of radiation-reactive systems having a covalently bound photoinitiator.

The compounds of the formula I are structurally derived from known photoinitiators. In the formula I, IN is any photoinitiator structure, which is linked to a functional reactive group RG via a spacer group A, which can, in principle, likewise be any spacer group.

In the compounds of the formula I, photoinitiator properties of structural part IN are thus combined with the non-photochemically induced reactivity i.e. coreactivity, of structural part RG.

IN is essentially the aromatic ketone structural

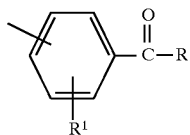

as is present in virtually all classical photoinitiators, but can alternatively be any other structures having photoinitiator properties.

If, in the aromatic ketone structural unit R is an optionally substituted phenyl ring, the result is photoinitiators of the benzophenone series. If, in this case, two $R^1$ radicals which are ortho to the carbonyl group together form a sulfur bridge between the phenyl rings, the result is thioxanthone photoinitiators. Coreactive thioxanthone derivatives are particularly preferred photoinitiators in the context of the invention.

If R is the —$CR^3R^4R^5$ group, with the abovementioned definitions for $R^3$, $R^4$ and $R^5$, the result is the photoinitiator basic structures of benzoin and acyloin ethers, benzil ketals and dialkoxyacetophenones, hydroxyalkyl-phenones and aminoalkylphenones, and α-sulfonylketones.

Coreactive hydroxyalkylphenone derivatives are likewise particularly preferred photoinitiators in the context of the invention.

If R is the

group, the resulting photoinitiators belong to the class of the acylphosphine oxides.

The spacer group A linking the photoinitiator basic structure IN to the reactive functional group RG preferably has the structure $Z[(CH_2)_oY]_n-[(CH_2)_mX]_l$.

In the simplest case, when X, Y and Z are each a single bond, the spacer group is an alkylene bridge, preferably having 1 to 8 carbon atoms. Such an alkylene group can also be linked to the aromatic ring of the photoinitiator basic structure via a heteroatom when X is —O—, —S— or —NH—.

However, the alkylene bridge may also be interrupted by one or more heteroatoms, which is the case when Y is —O—, —S— or —NH—. Interruptions of the alkylene bridge by carbonyl, carboxyl, carboxamide or urethane groups are also possible. Thus, for example, one or more oxy-, thio or aminoalkylene groups, preferably oxyethylene and thioethylene can function as spacers. Mixed heteroalkylene bridges, in particular those containing oxygen and sulfur as heteroatoms are likewise possible. Depending on the chemical nature of the functional reactive group RG, the latter is linked to the spacer group in accordance with the definitions where Z is a single bond, —O—, —S—, —NH— or a carboxyl group or a derivative thereof such as a carboxamide or urethane group.

Suitable reactive groups RG are all functional groups which are easily able to enter non-photochemically induced reactions. The aim of each such reaction is to bind the photoinitiator or photolysis products thereof into the system at a fixed location. Such reactions can be, for example, nucleophilic substitutions by or conversely on the RG group such as, for example, esterification, etherification or amidation. Besides halogen, such as, in particular, chlorine and bromine suitable RG groups are, above all, hydroxyl, thiol, carboxyl and sulfonyl groups and the equivalents thereof. Since, apart from halogens, these functional groups contain acidic H atoms, they are also able to react with isocyanate groups from the system to form urethanes or urethane analogues. Conversely, the isocyanate group is in turn a particularly preferred RG group since it can very easily be reacted with components of the system which contain functional groups having acidic H atoms.

Preferred reactive RG groups are likewise those which are able to undergo thermally initiated free-radical or ionic polymerization, polyaddition or polycondensation reactions. These include the vinyl group and the mono- or polymethylated analogues thereof, and the cyclopropyl and oxiranyl groups. Isocyanate-functionalized $C_{1-6}$-alkyl groups or phenyl groups are examples of groups which are capable of polyaddition. Insertion reactions into any desired components of the system can be accomplished by generating carbenes or free radicals, for example by means of the azide group as the reactive RG group. For covalent bonding, the typical reactions of the diazonium group are also suitable. Besides polysiloxane formation, the silyl group offers, in particular, the possibility of covalent linking to the substrate, especially when the latter is of an inorganic nature such as, for example, glass, ceramic or metal. In accordance with the definitions given for the photoinitiator basic structure IN, the spacer A and the reactive RG group, numerous coreactive photoinitiators having properties which are customized for a very wide variety of applications and purposes can be achieved through combination.

The compounds of the general formula I can be prepared by standard methods of organic chemistry. The reactions conditions here can be taken from standard works on preparative organic chemistry, for example, HOUBEN-WEYL, Methoden der organischen Chemie, [Methods of Organic Chemistry], Georg-Thieme Verlag, Stuttgart, or ORGANIC SYNTHESIS, J. Wiley, New York London Sydney.

It is generally favourable to prepare the photoinitiators according to the invention, or the precursors thereof, by proven synthetic methods, as are common for the known photoinitiators.

In this preparation it is advantageous to proceed directly from the known photoinitiators as starting materials and to link the spacer group A and the reactive group RG to these in one or more steps using common reactions, such as substitution reactions. However, precursors of known photoinitiators which are already suitably substituted can also be used and the actual photoinitiator active structure be generated in these only when the spacer and reactive groups are already present.

The compounds of the general formula I can be used according to the invention as photoinitiators for photopolymerization of ethylenically unsaturated compounds or for curing photopolymerizable systems which contain such compounds, and, in particular; also as UV hardeners for paint coatings, UV-curable binder and hybrid binder systems, printing inks and in radiation curing of aqueous prepolymer dispersions. This use takes place in a conventional fashion. The compounds to be used according to the invention are generally added to the systems to be polymerized in amounts from 0.1 to 20% by weight, preferably 0.5 to 12% by weight based on the weight of the entire system.

This addition generally takes place by simple dissolving and stirring in since most of the photoinitiators to be used according to the invention are liquid or at least readily soluble in the systems to be polymerized. A system to be polymerized is taken to mean a mixture of mono- or polyfunctional ethylenically unsaturated monomers, oligomers, prepolymers, or polymers, or mixtures of these oligomers, prepolymers and polymers with unsaturated monomers, which can be initiated by free radicals, it being possible for the mixture to contain, if necessary or desired, further additives, such as, for example, antioxidants, light stabilizers, colorants and pigments, but also further known photoinitiators and reaction accelerators. Suitable unsaturated compounds are all those whose C=C double bonds are activated by, for example, halogen atoms, carbonyl, cyano, carboxyl, ester, amide, ether or aryl groups or by conjugated further double or triple bonds. Examples of such compounds are vinyl chloride, vinylidene chloride, acrylonitrile, methacrylonitrile, acrylamide, methacrylamide, methyl, ethyl, n- or tert. butyl, cyclohexyl, 2-ethylhexyl, benzyl, phenoxyethyl, hydroxyethyl, hydroxypropyl, lower alkoxy ethyl, and tetrahydrofurfuryl acrylate or methacrylate, vinyl acetate, propionate, acrylate and succinate, N-vinyl pyrrolidone, N-vinylcarbazole styrene, divinylbenzene, substituted styrenes and mixtures of unsaturated compounds of these types. Polyunsaturated compounds, such as, for example, ethylene diacrylate, 1,6-hexanediol diacrylate, propoxylated bisphenol A diacrylate and dimethacrylate, trimethylolpropane diacrylate and pentaerythritol triacrylate, can also be polymerized with the photoinitiators used according to the invention. Suitable photopolymerizable compounds are, in addition, unsaturated oligomers, prepolymers or polymers, and mixtures thereof, with unsaturated monomers. These include, for example, unsaturated polyesters, unsaturated acrylic materials, epoxy materials, urethanes, silicones, aminopolyamide resins and, particularly, acrylated resins, such as acrylated silicone oil, acrylated polyesters, acrylated urethanes, acrylated polyamides, acrylated soybean oil, acrylated epoxy resin and acrylated acrylic resin, expediently in a mixture with ore or more acrylates of a mono-, di- or polyalcohol.

The photopolymerizable compounds or systems can be stabilized without thereby appreciably impairing the initiator action of the photoinitiators according to the invention by adding known thermal inhibitors and anti-oxidants such as, for example, hydroquinone or hydroquinone derivatives, pyrogallol, thiophenols, nitro compounds, β-naphthylamines or β-naphthols, in conventional amounts.

Such additions are intended, above all, to prevent premature polymerization during production of the systems through mixing of the components.

In addition, small amounts of light stabilizers such as, for example, benzophenone derivatives, benzotriazole derivatives, tetraalkylpiperidines or phenyl salicylates, can be added.

In order to exclude the inhibiting action of atmospheric oxygen, paraffin or similar waxy substances are frequently also added to photopolymerizable systems. As a consequence of poor solubility in polymers, these float at the beginning of the polymerization and form a transparent surface layer which prevents entry of air. It is also possible to deactivate the atmospheric oxygen, for example by introducing autooxidizable groups, such as, for example allyl groups, into the system to be cured.

The photoinitiators according to the invention can also be used in combination with known free-radical initiators such as, for example, peroxides, hydroperoxides, ketone peroxides or percarboxylates. In addition, they can contain pigments or dyes, as are customary, for example, in photochemically curing printing inks. In this case, the amount of photoinitiator is chosen to be higher, for example 6 to 12% by weight, whereas 0.1 to 5% by weight are fully sufficient in most cases for colorless photopolymerizable products. Depending on the intended application, fillers, such as talc, gypsum or silica, fibers, organic additives, such as thixotropic agents, levelling agents, binders, lubricants, flatting agents, plasticizers, wetting agents, silicones for improving the surface quality, antifloating agents or minor amounts of solvents can be added.

Suitable known photoinitiators which can be used, if appropriate, together with the initiators according to the invention, are, for example, benzophenones, such as, for example, Michler's ketone [4,4'-bis(dimethylamino)-benzophenone], 4,4'-bis(diethylamino)benzophenone, p-dimethylaminobenzophenone, p-chlorobenzophenone and benzophenone; anthraquinones, such as, for example, anthraquinone, 2-chloroanthraquinone and 2-alkylanthraquinones; xanthones, such as, for example 2-haloxanthones or 2-alkylxanthones; thioxanthones, such as 2-chlorothioxanthone and 2-alkylthioxanthones; acridanones, such as, for example, 2-alkylacridanones or N-substituted acridanones; benzoins, such as, for example, p-dimethylaminobenzoin and alkyl ethers of benzoin; benzil ketals, α-haloketones, dialkoxyacetophenones, α-hydroxyalkylphenones and α-aminoalkylphenones, as described, for example, in German Offenlegungsschrift 2,722,264 and European Offenlegungsschrift 3,002, and furthermore, for example, fluorenones, dibenzosuberones, phenanthrenequinones and benzoates, such as, for example, hydroxypropyl benzoate and benzoyl benzoate acrylate. Mixtures with known initiators generally contain the coreactive photoinitiators to be used according to the invention in proportions of at least 10% by weight, advantageously from 50 to 95% by weight relative to the total amount of the initiator mixture employed.

Besides the photoinitiators according to the invention, it is advantageous to employ reaction accelerators in the photopolymerizable systems. Examples of such compounds which can be added are organic amines, phosphines, alcohols and/or thiols all of which have at least one CH group in the α position to the heteroatom. For example, primary, secondary and tertiary aliphatic, aromatic, araliphatic or heterocyclic amines, as described, for example, in U.S. Pat. No. 3,759,807, are suitable. Examples of such amines are butylamine, dibutylamine, tributylamine, cyclohexylamine, benzyldimethylamine, dicyclohexylamine, triethanolamine, N-methyldiethanolamine, phenyldiethanolamine, piperidine, piperazine, morpholine, pyridine, quinoline, ethyl p-dimethylaminobenzoate, butyl p-dimethylamino benzoate, 4,4'-bis(dimethylamino)-benzophenone (Michler's ketone) or 4,4'-bis(diethylamino)-benzophenone. Particular preference is given to tertiary amines such as, for example, trimethylamine, triisopropylamine, tributylamine, octyldimethylamine, dodecyldimethylamine, triethanolamine, N-methyldiethanolamine, N-butyl-diethanolamine, tris(hydroxypropyl)amine, and alkyl dimethylamino benzoate. Further examples of suitable reaction accelerators are trialkyl phosphines, secondary alcohols and thiols. The addition of reaction accelerators of these types can take place in amounts which are conventional for them.

Photopolymerizable systems which additionally contain a tertiary organic amine as reaction accelerator represent a particularly preferred form of the present invention.

The term "photopolymerization of ethylenically unsaturated compounds" should be understood in the broadest sense. It also includes, for example, further polymerization or crosslinking of polymeric materials, such as prepolymers, the homo-, co- and terpolymerization of simple monomers and also the combination of the types of reaction mentioned.

The photopolymerization can be initiated through the action of high-energy irradiation, preferably UV light, on the photopolymerizable systems, containing coreactive photoinitiators according to the invention. The photopolymerization takes place by methods which are known per se, through irradiation with light or UV irradiation in the wavelength range from 250 to 500 nm, preferably 300–400 nm. Irradiation sources which may be used are sunlight or artificial-light lamps. Mercury high-pressure, medium-pressure or low-pressure lamps and xenon and tungsten lamps, for example, are advantageous.

The photopolymerization using the photoinitiators according to the invention can be carried out either batchwise or continuously. The duration of irradiation depends on the way in which the photopolymerization is carried out, on the type and quantity of polymerizable materials employed, on the type and concentration of photoinitiators used, and on the intensity of the light source and can be in the range from several seconds to minutes, such as, for example, on irradiation curing of coatings, but may also be in the hours region in the case of large batches such as, for example, in bulk polymerization.

The compounds of the formula I according to the invention are preferably used as photoinitiators in UV curing of thin coatings such as, for example, paint coatings, on all materials and substrates which are conventional for this. These can primarily be paper, wood, textile substrates, plastic and metal. An important area of application is also the drying or hardening of printing inks and screen printing materials, of which the latter are preferably employed in surface coating or shaping of, for example, cans, tubes and metal sealing caps. As a consequence of the substantial to complete absence of free initiator radicals after photopolymerization has taken place in systems to which coreactive photoinitiators according to the by invention have been added, the systems are particularly suitable in areas of application where diffusion of such radicals into media surrounding the corresponding final products is to be excluded, for example when packaging which is provided with photopolymerized coatings comes into contact with foodstuffs.

The essential classes of the coreactive photoinitiators according to the invention, typical representatives and the preparation and preferred manner of use thereof are shown below.

Compounds of the subformula II

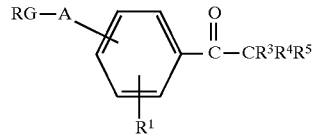

having the abovementioned meanings for the particular substituents essentially represent the particularly preferred coreactive photoinitiators of the hydroxyalkylphenone type ($R^3$ and $R^4$ are $C_{1-12}$-alkyl, $R^5$ is OH) and the amino alkyl-phenone type ($R^5$ is, if appropriate, also alkylsubstituted amino), and in addition coreactive derivatives of benzoin ethers ($R^3$ is phenyl, $R^4$ is H, $C_{1-12}$-alkyl or phenyl, $R^5$ is $C_{1-12}$-alkoxy), benzil ketals ($R^3$ s phenyl, $R^4$ and $R^5$ are $C_{1-12}$ alkoxy) and dialkoxyacetophenones ($R^3$ is H, $C_{1-12}$-alkyl, $R^4$ and $R^5$ are $C_{1-12}$-alkoxy).

Besides the functionalization of conventional photoinitiators which are commercially available or can be prepared by known methods, particular importance is attached in the preparation of compounds of the formula II in particular in the preferred hydroxyalkylphenone and aminoalkylphenone derivatives, to the preparation from appropriately substituted precursors on which the photoinitiators are based, an analogous procedure to methods which are known for this purpose being followed. These methods are described in detail, for example, in German Offenlegungsschrift 2,722,264 and European Offenlegungsschrift 3,002. Coreactive hydroxyalkylphenone derivatives can be obtained, for example from suitable phenyl derivatives which already contain the spacer group A and the functional group RG or appropriate precursors, by carrying out a Friedel-Crafts acylation using an appropriate acyl halide in order to introduce the active photoinitiator structure or a precursor thereof. Phenyl derivatives which can be employed as suitable starting materials are, for example, phenol, phenyl thiol, phenoxyacetic acid and mono- or polyethoxylated phenol, such as 2-hydroxyethyl phenyl ether. For the Friedel-Crafts acylation, it is advisable in some cases to protect the terminal functional groups by suitable protecting groups which can be removed later, such as by acylation in the case of the OH group. Aniline derivatives can be acylated under Vilsmeier conditions, for example using N,N-dimethylisobutyramide and phosphorus oxychloride.

In order to produce the active photoinitiator structure of the hydroxyalkyl phenone type, an acylation can be carried out, for example, using isobutyryl halide or α-chloroisobutyryl halide and subsequently introducing the hydroxyl, alkoxy or alkanoyloxy group. Thus, for example, Friedel-Crafts acylation of acylated 2-hydroxyethyl phenyl ether using isobutyryl chloride and subsequent bromination and hydrolysis on the tertiary carbon atom leads to the compound 4-(2-hydroxyethoxy)phenyl 2-hydroxy-2-propyl ketone.

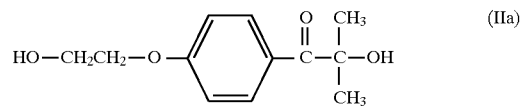

(IIa)

The compound IIa, which has already been described per se and as a photoinitiator for aqueous systems in German Offenlegungsschrift 3,512,179 is of central importance here since, due to the terminal OH group, it is capable, on the one hand, of coreactivity in the sense of the invention, but, on the other hand, can also serve as an intermediate for a large number of further coreactive photoinitiators which are derived from this and which contain other functional groups.

This compound is also especially suitable as a coreactive photoinitiator in hybrid binder systems. Such systems very generally contain at least one thermocuring component and one photochemically curing component. The thermocuring component is normally a two or multicomponent reaction resin, preferably of the polyol/polyisocyanate type. Suitable photochemically curing components are all monomeric, oligomeric or polymeric unsaturated compounds which are conventional for this purpose, and combinations thereof, whose polymerization or crosslinking takes place through the influence of high-energy irradiation and with the aid of the photoinitiator. Such hybrid systems can be obtained by mixing all the components, the isocyanate component, as usual for polyurethane-forming reactive resins, expediently not being added until just before use in order to prevent premature curing of the thermopolymerizing component. Coatings produced using such hybrid systems are cured by initially irradiating them in a fashion which is conventional for radiation-curing systems, rapid surface drying and curing of the coating being achieved. The fully cured state is reached after completion of the thermal reaction, which can also be accelerated by applying heat. The advantage of these systems over slow-drying systems on a purely thermal reactive resin basis is the considerable saving in time and energy; the coated articles can be stacked immediately or further processed more quickly.

The advantage of the coreactive photoinitiators according to the invention, such as compound IIa, on use in hybrid binder systems is that, in contrast to conventional photoinitiators, virtually no photoinitiator residues or photolysis products thereof can be detected in the fully cured polymer material, as shown by extraction experiments. Accordingly, the polymer products exhibit a relatively high final hardness. Adverse effects due to the initiator such as, for example, odor or yellowing, are not observed. Due to the coreactive OH group, the photoinitiator according to the invention is incorporated covalently into the polymer material through reaction with equivalent amounts of the isocyanate component of the thermally curing component in the hybrid binder system.

Compound IIa can also be fixed covalently in both purely radiation-curable systems and in hybrid systems through esterification by means of carboxylic acid group-containing components. Examples of such components are, for example, terephthalic acid, pyromellitic acid and anhydrides thereof, and oligomers or polymers which are derived from these compounds and contain at least one free carboxylic acid function.

Coreactive photoinitiators according to the invention which are derived from compound IIa are, for example:

4-[2-(oxiranylmethoxy)ethoxy]phenyl 2-hydroxy-2-propyl ketone

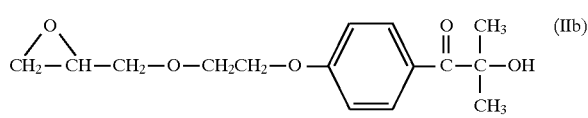
(IIb)

4-(2-allyloxyethoxy)phenyl 2-hydroxy-2-propyl ketone

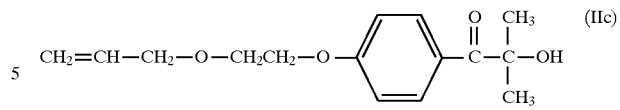
(IIc)

4-[2-(3-triethoxysilylpropoxy)ethoxy]phenyl 2-hydroxy-2-propyl ketone

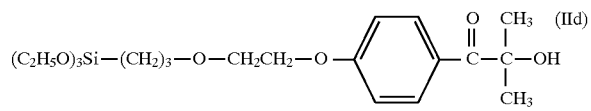
(IId)

4-(2-aminoethoxy)phenyl 2-hydroxy-2-propyl ketone

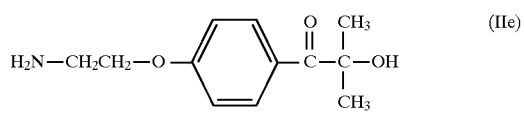
(IIe)

4-(2-azidoethoxy)phenyl 2-hydroxy-2-propyl ketone

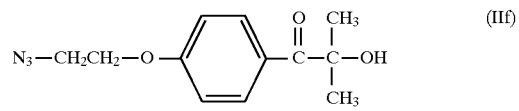
(IIf)

The compounds IIb and IIc can be obtained from IIa through reaction with epichlorohydrin or allyl bromide. Compound IId can be obtained from IIc through subsequent reaction with triethoxysilane.

Compound IIe can be prepared, for example, by hydrogenation of IIf.

Compound IIf is obtained by reacting the p-toluenesulfonate of IIa with sodium azide.

The epoxy-functionalized photoinitiator IIb can advantageously be employed, in particular, in hybrid binder systems whose thermocurable component is a reactive resin of the epoxy type. Due to the epoxy function, IIb or its photolysis products are bound virtually completely into the epoxy polymer of the binder system.

The photoinitiator IIc which is functionalized with an unsaturated component can be copolymerized with unsaturated components of any radiation-curable compositions. It can also be thermally polymerized itself. The resultant polymeric photoinitiator can be added to radiation-curable compositions, where it remains migration-resistant, due to its polymeric character. It can also be initially applied only as a polymeric initiator coating to a substrate. A photocurable paint coating which is applied on top and which does not require any further addition of initiator can then be cured with excellent substrate adhesion.

The silyl-functionalized initiator IId can be employed in an analogous fashion, its use bringing advantages primarily in the coating of inorganic substrates such as metals, glass or other silicate materials, due to the adhesion-improving silyl groups.

Compound IIe can be employed analogously to IIa; compound IIf is highly reactive due to the azido group and is capable, for example, of insertion reactions.

The carboxylic acid-functionalized photoinitiator 4-(hydroxycarbonylmethoxy)phenyl 2-hydroxy-2-propyl ketone

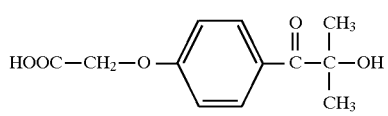

allows fixing by reactions which are typical of carboxylic acids such as salt formation, esterification, acid amide formation etc. Fixing by esterification with macromolecular polyhydroxyl compounds, such as cellulose and related materials is particularly important.

In materials which have been modified in this fashion, a very high initiator concentration is achieved at the surface which is very advantageous for subsequent further modification using photopolymerizable materials, such as in photoinitiated grafting of monomers ("photografting").

The following coreactive photoinitiators can be prepared in an analogous fashion and can be used like the abovementioned compounds:

4-allyloxyphenyl 2-hydroxy-2-propyl ketone

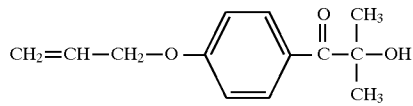

4-oxiranylmethoxyphenyl 2-hydroxy-2-propyl ketone

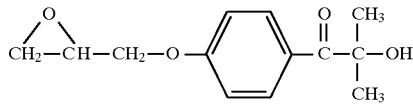

4-[3-(triethoxysilyl)propoxy]phenyl 2-hydroxy-2-propyl ketone

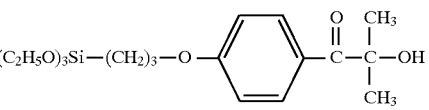

4-[2-(3-triethoxysilylpropylthio)ethyl]phenyl 2-hydroxy-2-propyl ketone

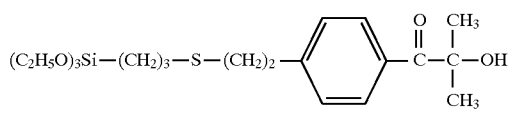

4-(2-chloroethoxy)phenyl 2-hydroxy-2-propyl ketone

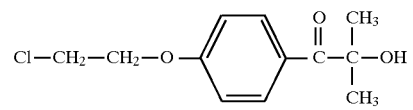

4-(oxiranylmethoxycarbonylmethoxy)phenyl 2-hydroxy-2-propyl ketone

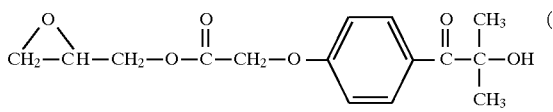

4-oxirany(methoxyphenyl α-isopropoxybenzyl ketone

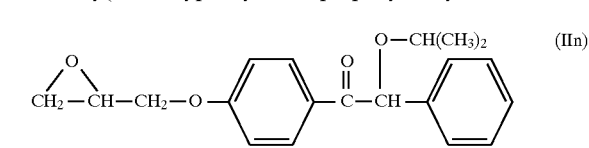

4-[3-(triethoxysilyl)propoxy]phenyl α-isopropoxybenzyl ketone

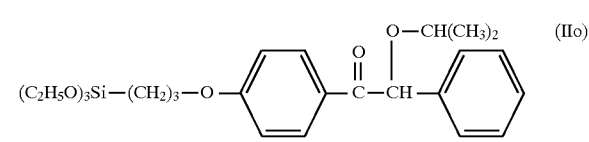

4-oxiranylmethoxyphenyl α,α-dimethoxybenzyl ketone

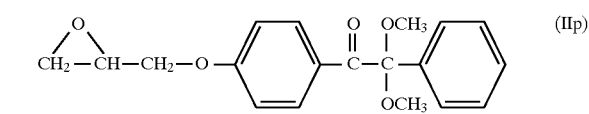

4-[3-(triethoxysilyl)propoxy]phenyl α,α-dimethoxybenzyl ketone

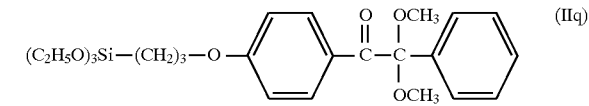

4-(2-isocyanatoethoxy)phenyl 2-hydroxy-2-propyl ketone

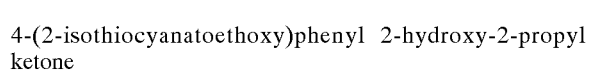

4-(2-isothiocyanatoethoxy)phenyl 2-hydroxy-2-propyl ketone

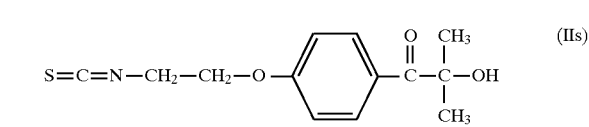

4-(2-hydroxy-2-methylpropionyl)phenoxyacetamide

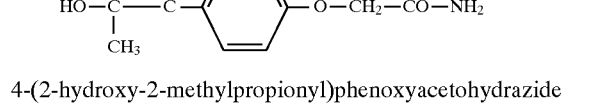

4-(2-hydroxy-2-methylpropionyl)phenoxyacetohydrazide

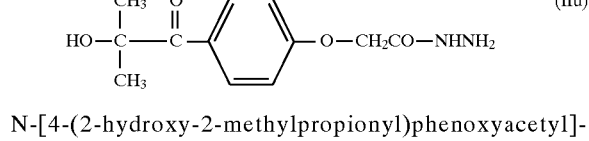

N-[4-(2-hydroxy-2-methylpropionyl)phenoxyacetyl]-hydroxylamine

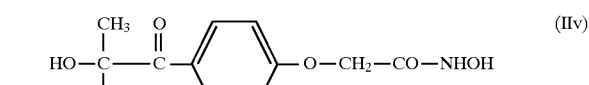

N-[4-(2-hydroxy-2-methylpropionyl)phenoxyacetyl]-N'-acryloylhydrazine

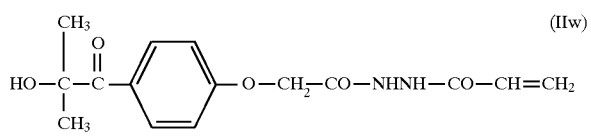

(IIw)

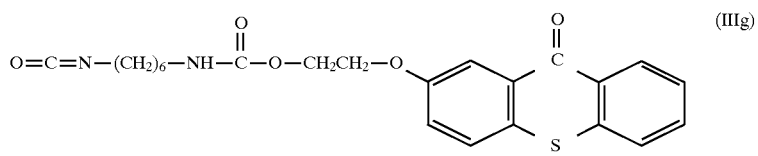

(IIIg)

obtained, for example, through reaction with acrylyl chloride or allyl bromide.

These compounds are highly suitable as photoinitiators which can be copolymerized with unsaturated components of radiation-curable compositions. However, they can also be thermally polymerized by themselves and used as polymeric photoinitiators as described for compound IIc.

Isocyanate-functionalized photoinitiators, such as, for example 2-[2-(6-isocyanatohexylaminocarbonyloxy) ethoxy]thioxanthone 4-isocyanatomethoxyphenyl 2-hydroxy-2-propyl ketone

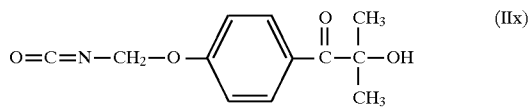

(IIx)

vinyl 4-(2-hydroxy-2-methylpropionyl)phenoxyacetate

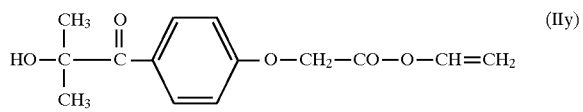

(IIy)

Compounds of the subformula III

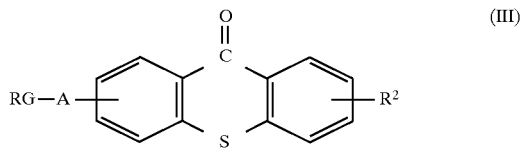

(III)

having the abovementioned meanings for the respective substituents represent the likewise particularly preferred coreactive photoinitiators of the thioxanthone type.

Starting materials for these are commercially available thioxanthone photoinitiators, or derivatives thereof, which are predestined for simple introduction of the spacer group A and functional groups RG. Particularly suitable such starting materials are 2-chlorothioxanthone and 2-hydroxythioxanthone.

The hydroxyl-functionalized photoinitiator 2-(2-hydroxyethylthio)thioxanthone (IIIa) is obtained by reacting 2-chlorothioxanthone with, for example, 2-mercaptoethanol.

The amino-functionalized photoinitiator 2-(2-aminoethylthio)thioxanthone (IIIb) can be obtained in a similar fashion.

Both compounds can be employed entirely analogously to compound IIa as coreactive photoinitiators, in particular also in hybrid binder systems.

Compounds IIIa and IIIb, likewise entirely analogously to compounds IIa, can also in turn serve as the starting material for further coreactive photoinitiators having other functional groups. Thus, the photoinitiators 2-[2-(acryloyloxy) ethylthic]thioxanthone (IIIc) 2-[2-(acryloylamino)ethylthio] thioxanthone (IIId) 2-[2-(allyloxy)ethylthio]thioxanthone (IIIe) and 2-[2-(allylamino)ethylthio]thioxanthone (IIIf) which are functionalized by an unsaturated group can be can be obtained by reacting IIIa with an equivalent amount of a diisocyanate. Covalent binding into the radiation-curable polymer system can take place through reaction of the isocyanate group with OH groups of the components. Use in hybrid binder systems which contain, as thermocurable component, a polyurethane-forming reactive system is particularly favourable. The isocyanate-functionalized photoinitiator can be mixed here with the isocyanate hardener of the reactive resin component, and this mixture can be used, as it were, as a "hybrid hardener".

In an analogous fashion, as described for the corresponding compounds of the subformula II, epoxy-, silyl- and carboxylic acid-functionalized thioxanthone derivatives can be obtained and correspondingly employed, such as, for example, the compounds 2-(oxiranylmethoxy)thioxanthone (IIIh) and 2-[3-(triethoxysilyl)propoxy]thioxanthone (IIIi).

The coreactive photoinitiators of this invention are preferably added to the mixture to be polymerized prior to initiation of the photopolymerization reaction. This invention preferably is applied to non-aqueous systems, e.g., polymerizable compositions containing no more than about 10% of water.

Further details regarding the structures of the photoinitiator component, the polymerizable monomers and prepolymers, the curable prepolymers, polymeric oligomers and the thermocurable components, as well as other conventional aspects of the use of photoinitiators are known and disclosed in, e.g., German Offenlegungsschrift 2,722,264 (U.S. Pat. No. 4,347,111), European Offenlegungschrift 3,002 (U.S. Pat. No. 4,308,400) and the other references cited above Without further elaboration, it is believed that one skilled in the art can, using the preceding description; utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire text of all applications, patents and publications, if any, cited above and below are hereby incorporated by reference.

EXAMPLE 1

4-(2-Hydroxyethoxy)phenyl 2-hydroxy-2-propyl ketone (IIa)

a) 336 g (3.2 mol) of isobutyryl chloride are added dropwise over the course of 40 minutes while stirring to 880 g (8.8 mol) of anhydrous aluminium chloride in 480 ml of dichloromethane at −5° to 0° C. 540 g (3.0 mol) of 2-phenoxyethyl acetate are then added dropwise over the course of 2 hours at the same temperature. The reaction mixture is stirred for a further 2 hours at the stated temperature and then poured into a mixture of 1.8 l of concentrated hydrochloric acid and 5 kg of ice. The organic phase is separated off and the aqueous layer is extracted with dichloromethane. The combined organic phases are washed with water, dried and evaporated, and the residue is distilled in vacuo. 740 g of 4-(2-acetoxyethoxy)phenyl-2-propyl ketone of boiling point 145°–152° C./0.3–0.5 torr are obtained.

b) 205 g (1.0 mol) of 4-(2-acetoxyethoxy)phenyl 2-propyl ketone are dissolved in 200 ml of glacial acetic acid, and 192 g (1.2 mol) of bromine are added over the course of 2 hours with stirring at 25° C. The mixture is then stirred for about a further 10 hours and then poured into 3 l of ice water. The product is extracted with ethyl acetate. The combined extracts are dried, and 365 g of a viscous oil are obtained by evaporation. This oil is dissolved in 1 l of ethanol, and 380 g of 32% strength sodium hydroxide solution are added over the course of 20 minutes with stirring at 25° C. The mixture is stirred for a further 10 minutes and the ethanol is then removed. The oily residue is transferred into 3 l of ice water, and this mixture is extracted repeatedly with a total of 1.5 l of ethyl acetate. After drying, filtering and evaporating the solution, 250 g of an oily crude product are isolated. Through recrystallization from acetone/petroleum ether and/or chromatographic purification, 145 g of 4-(2-hydroxyethoxy)phenyl 2-hydroxy-2-propyl ketone are obtained in the form of a colourless solid of melting point 88°–90° C.

EXAMPLE 2

4-(2-allyloxyethoxy)phenyl 2-hydroxy-2-propyl ketone (IIc)

26.8 g (0.22 mol) of allyl bromide and 1.8 g of methyltrioctylammonium chloride as phase-transfer catalyst are added to a mixture of 44.9 g (0.2 mol) of IIa and 8.8 g (0.22 mol) of granulated sodium hydroxide in 300 ml of toluene, and the mixture is stirred for 20 hours at 50° C. The mixture is then extracted with toluene. Conventional work-up and chromatographic purification give 28.5 g of the analytically pure compound IIc.

EXAMPLE 3

4-[2-(Oxiranylmethoxy)ethoxy]phenyl 2-hydroxy-2-propyl ketone (IIb)

Through reaction analogously to example 2, but using epichlorohydrin, compound IIb is obtained.

EXAMPLE 4

4-[2-(3-Triethoxysilylpropoxy)ethoxy]phenyl 2-hydroxy-2-propyl ketone (IId)

5.3 g (0.02 mol) of compound IIc, 4.9 g (0.03 mol) of triethoxysilane and 20 mg of platinum catalyst (norbornene-Pt acetylacetonate complex) in 50 ml of methylene chloride are refluxed for 4 hours under nitrogen. After evaporation of the mixture and chromatographic purification of the residue, 3.4 g of the analytically pure compound IId are obtained.

EXAMPLE 5

4-(hydroxycarbonylmethoxy)phenyl 2-hydroxy-2-propyl ketone (IIg)

612 g of compound IIg of melting point 131°–134° C. are obtained analogously to Example 1 from 931 g (5.6 mol) of methyl phenoxyacetate by Friedel-Crafts acylation using 657 g (6.2 mol) of isobutyryl chloride and subsequent bromination and hydrolysis.

EXAMPLE 6

4-(2-Hydroxy-2-methylpropionyl)phenoxyacetamide (IIt)

75.0 g of 25% strength ammonia are added dropwise with stirring to 25.2 g (0.1 mol) of methyl 4-(2-hydroxy-2-methylpropionyl) phenoxyacetate (obtained by esterifying compound IIg using methanol) in 50 ml of dioxane. After being stirred for 2 hours, the mixture is evaporated to solidification. The crude product is recrystallized from hot water, 22.1 g of compound IIt of melting point 139° C. being obtained.

EXAMPLE 7

4-(2-Azidoethoxy)phenyl 2-hydroxy-2-propyl ketone (IIf)

37.8 g (0.1 mol) of 4-(2-p-tolylsulfonyloxyethoxy)-phenyl 2-hydroxy-2-propyl ketone (obtained by reacting compound IIa with p-toluenesulfonyl chloride) and 9.8 g (0.15 mol) of sodium azide are stirred for one hour in 100 ml of DMSO at 60° C. Through extractive work-up using water and ether or methyl t-butyl ether, 22.4 g of compound IIf are obtained as a pale yellow, readily mobile oil. IR: $v=2114$ cm$^{-1}$(N$_3$).

EXAMPLE 8

4-Allyloxyphenyl 2-hydroxy-2-propyl ketone (IIh)

6.6 g (0.22 mol) of sodium hydride (80% strength in paraffin oil) are added in portions to 36.0 g (0.2 mol) of 4-hydroxyphenyl 2-hydroxy-2-propyl ketone in 450 ml of dimethyl sulfoxide under an inert gas and the mixture is stirred for 15 minutes at room temperature. 26.8 g (0.22 mol) of allyl bromide in 40 ml of dimethyl sulfoxide are then added dropwise at 30°–40° C., and the mixture is stirred for 15 minutes. The reaction mixture is poured into 2 l of water and then extracted with methyl t-butyl ether. By removing the solvent, 41.5 g of compound IIh are obtained.

EXAMPLE 9

4-Oxiranylmethoxyphenyl 2-hydroxy-2-propyl ketone (IIi)

Analogously to Example 3, 6.8 g of the analytically pure compound IIi of melting point 54° C. are obtained from 36.0 g (0.2 mol) of 4-hydroxyphenyl 2-hydroxy-2-propyl ketone and 19.0 g (0.2 mol) of epichlorohydrin.

EXAMPLE 10

4-[3-(Triethoxysilyl)propoxy]-phenyl 2-hydroxy-2-propyl ketone (IIj)

Analogously to Example 4, 10.2 g of the analytically pure compound IIj are obtained from 14.3 g (0.065 mol) of IIg and 16.0 g (0.0975 mol) of triethoxysilane.

EXAMPLE 11

2-(2-Hydroxyethylthio)thioxanthone (IIIa)

5.6 g (0.0225 mol) of 2-chlorothioxanthone and 2.6 g (0.0225 mol) of the potassium salt of 2-mercaptoethanol are stirred for 18 hours in 20 mol of N,N-dimethylacetamide at 100° C. The reaction mixture is then poured into 2N hydro-chloric acid and extracted with ethyl acetate. After conventional work-up and chromatographic purification, 3.5 g of the analytically pure compound IIIa of melting point 94° C. are obtained.

EXAMPLE 12

2-(2-Aminoethylthio)thioxanthone (IIIb)

17.0 g (0.15 mol) of cysteaminium chloride and 19.8 g (0.3 mol) of potassium hydroxide are boiled for 3 hours on a water separator in 180 ml of toluene. 24.6 g (0.1 mol) of 2-chlorothioxanthone and 180 mol of dimethylpropyleneurea are added to the evaporated residue, and the mixture is stirred for 20 hours at 100° C. The reaction mixture is poured into 1 l of 2N hydrochloric acid and the aqueous phase is extracted with ethyl acetate. The aqueous phase is then adjusted to pH 10 and extracted with ethyl acetate. Work-up of the organic phase gives 24.0 g of the analytically pure compound IIIb.

EXAMPLE 13

2-[2-(acryloyloxy)ethylthio]thioxanthone (IIIc)

6.8 g (0.075 mol) of acrylyl chloride in 30 ml of toluene are added dropwise with stirring to 14.0 g (0.05 mol) of compound IIIa, 6.0 g of pyridine and 0.07 g of 4-methoxyphenol in 150 ml of toluene at room temperature. After stirring for 3 hours at 50° C., 500 ml of water and 250 ml of ethyl acetate are added to the mixture. Work-up of the organic phase and chromatographic purification give 5.0 g of the analytically pure compound IIIc of melting point 68°–71° C.

EXAMPLE 14

2-[2-(Acryloylamino)ethylthio]thioxanthone (IIId)

Analogously to Example 10, 4.6 g of the analytically pure compound IIId of melting point 161° C. are obtained from 14.5 g (0.05 mol) of compound IIIb and 5.0 g (0.055 mol) of acrylyl chloride.

EXAMPLE 15

Polymeric Photoinitiator 18.6 g (0.05 mol) of 2-[2-(acryloyloxy)ethylthio]-thioxanthone (IIe) and 0.15 g of dibenzoyl peroxide are refluxed for 20 hours in 100 ml of toluene. The polymeric product obtained is purified by reprecipitation from methylene chloride/n-hexane. A yellow amorphous powder, whose average molecular weight is determined at about 3200 by means of gel-permeation chromatography, is obtained.

Examples 16–21 below illustrate the use according to the invention of the coreactive photoinitiators in radiation curing of photopolymerizable binder systems.

EXAMPLE 16

Hybrid Binder System

A hybrid binder system comprising 40.5 parts by weight of a hydroxyl group-containing polyacrylate/about 65% strength in butyl acetate/xylene (Desmophen® A 365, Messrs. Bayer AG), 17.0 parts by weight of an aliphatic polyisocyanate/about 75% strength in methoxypropyl acetate/xylene (Desmodur® N 75, Messrs. Bayer AG), 30.0 parts by weight of an acrylated polyurethane prepolymer (VPS 1748, Messrs. Degussa AG), 20.0 parts by weight of hexanediol diacrylate, 7.5 parts by weight of pentaery-thritol triacrylate and 5.0 parts by weight of the hydroxyl-functionalized photoinitiator IIa was prepared by mixing the components, the polyisocyanate not being added until just before use.

The ready-to-use hybrid binder system was applied in a coating thickness of 50 μm using a spiral hand coater onto glass plates (10×10 cm). After a drying time of 5 minutes, the coatings were cured using a UV irradiator (Messrs. Beltron), through which the plates are fed on a conveyor belt at a belt speed between 2.5 and 40 m/min under two Hg medium-pressure lamps of power 50 watt/cm each at a distance of 10 cm.

At belt speeds between 2.5 and 15 m/min, solid paint coatings with a dry surface were obtained immediately.

Thermal post-curing of the polyurethane reactive resin component gave a final hardness of the coatings of:

| | |
|---|---|
| for 20 hours/room temperature: | 168 seconds |
| for 1 hour/60° C.: | 188 seconds |
| for 3 hours/60° C.: | 198 seconds |
| | König pendulum hardness |

After extraction of fully cured coating material with acetonitrile, the proportion of initiator which is not bound into the material is determined by means of high-pressure liquid chromatography at a maximum of 3% of the original amount employed.

In an analogous fashion, equally good results are obtained using initiators IIIa and IIIb.

EXAMPLE 17

UV-Curable Binder System

A UV-curable binder system comprising 60 parts by weight of an acrylated polyurethane prepolymer (prepolymer VSP 1748, Messrs. Degussa AG), 40 parts by weight of hexanediol diacrylate, 15 parts by weight of pentaery-thritol triacrylate and 5 parts by weight of the photoinitiator IIc which is functionalized with unsaturated groups, was processed analogously to Examples 16 to give 50 μm thick coatings and cured at a belt speed of 10 m/min. The fully cured coatings obtained are entirely free of odour and colourless.

In an analogous fashion, equally good results are obtained using initiators IIh and IIIc–IIIf.

EXAMPLE 18

UV-Curable Pigmented Binder System 30 parts by weight of titanium dioxide (anatase) were incorporated homogeneously into 60 parts by weight of an acrylated epoxy prepolymer (Laromer® PE 55 F, Messrs. BASF AG) and 40 parts by weight of hexanediol diacrylate. 4 parts by weight of the thioxanthone photoinitiator IIIc which is functionalized by unsaturated groups and 8 parts by weight of N-methyldiethanolamine as coinitiator are subsequently stirred into the mixture. It was possible to harden the paint, applied to glass plates in a coating thickness of 12 μm at belt speeds between 2.5 and 20 m/min and an irradiation power of 120 W/cm to give solid coatings having a dry surface.

At a belt speed of 2.5 m/min, the König pendulum hardness is 155 seconds. Paint films are odourless and yellowing-free.

EXAMPLE 19 on curing at 2.5 m/min, the corresponding use of the hydroxyl-functionalized thioxanthone photoinitiator IIIa gave paint coatings having a pendulum hardness of 149 seconds.

EXAMPLE 20
UV-Curable Binder System

It was possible to cure coatings of thickness 50 μm with a system comprising 75 parts by weight of an acrylated epoxy prepolymer (Laromer® EA 81, Messrs. BASF AG) and 25 parts by weight of hexanediol diacrylate at a belt speed of 2.5 m/min and an irradiation power of 80 W/cm with initiation using 0.5% by weight of the thioxanthone derivative IIId which is functionalized by unsaturated groups and 2.0% by weight of N-methytdiethanolamine to give paint coatings having a pendulum hardness of 172 seconds.

EXAMPLE 21
Coating Curing Using Substrate-Bound Initiator

A 25% strength ethanolic solution of the silyl-functionalized photoinitiator IId was whirler coated onto glass plates (5×5 cm), and the plates thus treated were heated for 30 minutes at 190° C. The plates were then rinsed with acetone and coated with a mixture of 75 parts by weight of an acrylated epoxy prepolymer (Laromer® EA 81, Messrs. BASF AG) and 25 parts by weight of hexanediol diacrylate. After UV curing at 3.75 m/min and an irradiation power of 120 W/cm and rinsing again with acetone, hard, very strongly adherent coatings of thickness 0.7–0.8 μm were obtained.

Corresponding results are obtained using initiator IIj.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a process for photopolymerizing an ethylenically unsaturated compound in the presence of an admixture of said compound and photoinitiator, the improvement wherein the photoinitiator is a coreactive compound of the formula:

RG—A—IN in which

IN is of the formula

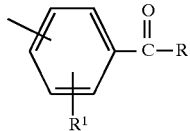

wherein

R is —$CR^3R^4R^5$ or —$P(=O)(R^6)_2$, each $R^1$ independently is H, $C_{1-12}$-alkyl, halogen, an RG—A—group or two $R^1$ radicals in the position ortho to the carbonyl group together are —S—, $R^3$ and $R^4$ are in each case independently of one another H, $C_{1-12}$-alkyl, $C_{1-12}$-alkenyl, $C_{1-12}$-alkoxy, phenyl or together with the C-atom to which they are bonded form a $C_3$-$C_7$-cyclo-alkylene ring, $R^5$ is —$OR^7$, —$N(R^7)_2$, piperidino, 1-piperazinyl, morpholino or —$SO_2R^7$, $R^6$ is $C_{1-6}$-alkyl, $C_{1-6}$-alkanoyl, phenyl or benzoyl, each of which is optionally substituted by halogen, $C_{1-6}$-alkyl or $C_{1-6}$-alkoxy, $R^7$ is H, $C_{1-6}$-alkyl or $C_{1-6}$-alkanoyl, A is a spacer group $Z[(CH_2)_oY]_n$-$[(CH_2)_mX]_l$ wherein X, Y and Z are independently of one another a single bond, —O—, —S—, —NH—, —CO—, —COO—, —CONH—, —O—CO—, —NH—CO— or —NH—COO—, l and m are the integers from 1 to 4, n and o are the integers from 0 to 4, RG is one of the functional reactive groups halogen, $NH_2$—CO—, O=C=N—, S=C=N—, $N_3$—, —$SO_2Cl$ or $R^cR^bC=CR^a$- wherein $R^a$, $R^b$ and $R^c$ are independently of each other H or methyl, and with the proviso that Z is not —COO— when n is 0, and $R^5$ is —$OR^7$, or RG is halogen, cyclopropyl, oxiranyl, O=C=N—$R^d$,

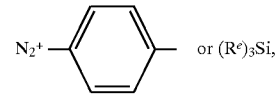

$R^d$ is $C_{1-6}$-alkylene or phenylene, and $R^e$ is halogen, $C_{1-12}$-alkyl, $C_{1-12}$-alkoxy or $C_{1-12}$-alkanoyloxy.

2. A process of claim 1, wherein R is —$CR^3R^4R^5$.

3. A process of claim 1, wherein R is —$P(R^6)_2$.

4. A process of claim 1, wherein RG is capable of reacting with a reactant by nucleophilic substitution.

5. A process of claim 4, wherein the amount of compound added is from about 0.1 to about 20% by weight based on the weight of the entire system.

6. A process of claim 1, wherein RG contains an acidic hydrogen atom.

7. A process of claim 1, wherein RG is capable of undergoing a thermally initiated free radical or ionic polymerization, polycondensation or a polyaddition reaction.

8. A process of claim 1, wherein the photopolymerization is conducted in the presence of another photoinitiator or a sensitizer selected from the group consisting of the benzophenones, anthraquinones, xanthones, thioxanthones, acridanones and N-substituted acridanones, benzoins and alkyl ethers of benzoin, benzil ketals, α-haloketones, dialkylaceto-phenones, α-hydroxyalkylphenones and α-aminoalkylphenones, fluorenones, dibenzosuberones, phenathrenequinones and benzoates.

9. A process of claim 1, wherein said admixture comprises a radiation curable coating containing a UV-curable paint and binder systems.

10. A process of claim 1, wherein at least one compound of claim 1 is added as a coreactive photoinitiator to the mixture to be polymerized prior to of the photopolymerization.

11. A photopolymerizable system comprising
   a) an ethylenically unsaturated photopolymerizable compound, and
   b) as a coreactive photoinitiator, a compound of the formula

RG—A—IN in which

IN is of the formula

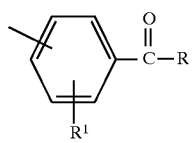

wherein

R is —CR$^3$R$^4$R$^5$ or —P(=O)(R$^6$)$_2$, and each R$^1$ independently is H, C$_{1-12}$-alkyl, halogen, an RG—A—group or two R$^1$ radicals in the position ortho to the carbonyl group together are —S—, R$^3$ and R$^4$ are in each case independently of one another H, C$_{1-12}$-alkyl, C$_{1-12}$-alkenyl, C$_{1-12}$-alkoxy, phenyl or together with the C-atom to which they are bonded form a C$_3$-C$_7$-cyclo-alkylene ring, R$^5$ is —OR$^7$, —N(R$^7$)$_2$, piperidino, 1-piperazinyl, morpholino or —SO$_2$R$^7$, R$^6$ is C$_{1-6}$-alkyl, C$_{1-6}$-alkanoyl, phenyl or benzoyl, each of which is optionally substituted by halogen, C$_{1-6}$-alkyl or C$_{1-6}$-alkoxy, R$^7$ is H, C$_{1-6}$-alkyl or C$_{1-6}$-alkanoyl, A is a spacer group Z[(CH$_2$)$_o$Y]$_n$-[(CH$_2$)$_m$X]$_l$ wherein X, Y and Z are independently of one another a single bond, —O—, —S—, —NH—, —CO—, —COO—, —CONH—, —O—CO—, —NH—CO— or —NH—COO—, l and m are the integers from 1 to 4, n and o are the integers from 0 to 4, RG is one of the functional reactive groups halogen, NH$_2$—CO—, O=C=N—, S=C=N—, N$_3$—, —SO$_2$Cl or R$^c$R$^b$C=CR$^a$—wherein R$^a$, R$^b$ and R$^c$ are independently of each other H or methyl, and with the proviso that Z is not —COO— when n is 0, and R$^5$ is —OR$^7$, or RG is halogen, cyclopropyl, oxiranyl, O=C=N—R$^d$,

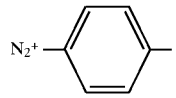

R$^d$ is C$_{1-6}$-alkylene or phenylene, and

R$^e$ is halogen, C$_{1-12}$-alkyl, C$_{1-12}$-alkoxy or C$_{1-12}$-alkanoyloxy.

12. A system of claim 5, wherein the amount of said photoinitiator is from about 0.1 to about 20% based on the weight of the entire system.

13. A system of claim 5, wherein the amount of said photoinitiator is from about 0.5% to about $_{12}$% based on the weight of the entire system.

14. A system of claim 5 further comprising conventional additives.

15. A hybrid binder system comprising, a) a thermocurable component, b) a photochemically curable component, and c) as a coreactive photoinitiator, a compound of the formula

RG—A—IN in which

IN is of the formula

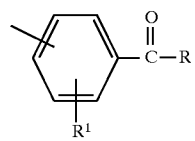

wherein

R is —CR$^3$R$^4$R$^5$ or —P(=O)(R$^6$)$_2$, and each R$^1$ independently is H, C$_{1-12}$-alkyl, halogen, an RG—A— group or two R$^1$ radicals in the position ortho to the carbonyl group together are —S—, R$^3$ and R$^4$ are in each case independently of one another H, C$_{1-12}$-alkyl, C$_{1-12}$-alkenyl, C$_{1-12}$-alkoxy, phenyl or together with the C-atom to which they are bonded form a C$_3$-C$_7$-cyclo-alkylene ring, R$^5$ is —OR$^7$, —N(R$^7$)$_2$, piperidino, 1-piperazinyl, morpholino or —SO$_2$R$^7$, R$^6$ is C$_{1-6}$-alkyl, C$_{1-6}$-alkanoyl, phenyl or benzoyl, each of which is optionally substituted by halogen, C$_{1-6}$-alkyl or C$_{1-6}$-alkoxy, R$^7$ is H, C$_{1-6}$-alkyl or C$_{1-6}$-alkanoyl, A is a spacer group Z[(CH$_2$)$_o$Y]$_n$-[(CH$_2$)$_m$X]$_l$ wherein X, Y and Z are independently of one another a single bond, —O—, —S—, —NH—, —CO—, —COO—, —CONH—, —O—CO—, —NH—CO— or —NH—COO—, l and m are the integers from 1 to 4, n and o are the integers from 0 to 4, RG is one of the functional reactive groups halogen, NH$_2$—CO—, O=C=N—, S=C=N—, N$_3$—, —SO$_2$Cl or R$^c$R$^b$C=CR$^a$— wherein R$^a$, R$^b$ and R$^c$ are independently of each other H or methyl, and with the proviso that Z is not —COO— when n is 0, and R$^5$ is —OR$^7$, or RG is halogen, cyclopropyl, oxiranyl, O=C=N—R$^d$,

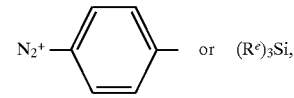

R$^d$ is C$_{1-6}$-alkylene or phenylene, and

R$^e$ is halogen, C$_{1-12}$-alkyl, C$_{1-12}$-alkoxy or C$_{1-12}$-alkanoyloxy.

16. A hybrid binder of claim 14, wherein RG contains an acidic hydrogen atom.

17. A system of claim 16, wherein the amount of said photoinitiator is from about 0.5% to about 12% based on the weight of the entire system.

* * * * *